United States Patent [19]

Gomi

[11] Patent Number: 5,189,502
[45] Date of Patent: Feb. 23, 1993

[54] SEMICONDUCTOR DEVICE HAVING VENTILATIVE INSULATING FILMS

[75] Inventor: Hideki Gomi, Tokyo, Japan

[73] Assignee: NEC Corporation, Tokyo, Japan

[21] Appl. No.: 696,845

[22] Filed: May 7, 1991

[30] Foreign Application Priority Data

May 8, 1990 [JP] Japan .................................. 2-118164

[51] Int. Cl.[5] ............................................ H01L 29/34
[52] U.S. Cl. ..................................... 257/759; 257/760
[58] Field of Search .............................. 357/54, 55, 71

[56] References Cited

U.S. PATENT DOCUMENTS 4,984,055 1/1991 Okumura et al. ..................... 357/54

OTHER PUBLICATIONS

"Interlevel Dielectric Planarization With Spin-On Glass Films", L. B. Vines and S. K. Gupta, Jun. 9-10, 1986 V-MIC Conf., IEEEE.

*Primary Examiner*—Edward J. Wojciechowicz
*Attorney, Agent, or Firm*—Burns, Doane, Swecker & Mathis

[57] ABSTRACT

A semiconductor device including a first wiring layer, and insulator layer formed on the first wiring layer and including a first silicon oxide film, a spin-coated insulating film formed on the first silicon oxide film and a second silicon oxide film formed on the spin-coated insulating film, a through-hole selectively formed in the insulator layer to expose a part of the first wiring layer, and a second wiring layer formed on the insulator layer and in contact with the part of the first wiring layer exposed through the through-hole, wherein the second silicon oxide film has a density lower than the density of the first silicon oxide film and allows gas from the spin-coated insulating film to go through the second silicon oxide film.

6 Claims, 3 Drawing Sheets

SEMICONDUCTOR DEVICE HAVING VENTILATIVE INSULATING FILMS

BACKGROUND OF THE INVENTION

The present invention relates to a semiconductor device, and more particularly to a semiconductor device comprising a multilevel interconnection composed of plural wiring layers with insulating layers inserted therebetween.

DESCRIPTION OF THE PRIOR ART

The use of the multilevel interconnection in a semiconductor device, typically in LSI circuits, is an important technique to realize a high density semiconductor device, because it gives freedom to the arrangement and to connection of the elements formed mainly upon the surface of the semiconductor substrate. The sizes of the elements are intended to be small to increase the integration density of a semiconductor device, and the wiring pattern to interconnect them upon the chip needs a larger ratio of the chip area because the ratio of the wiring pattern area to the total chip surface area becomes quite large. Since the reduction of the wiring pattern is limited due to the limitation of the current capacity and wiring resistance, the multilevel interconnection is highly desirable.

The advantages of the multilevel interconnection are the realization of high integration density and reduction of chip size. Moreover, there are other advantages, such as an increase of the wiring freedom and easy design of wiring pattern. The setting of the wiring resistance and current capacity can be made with ample margin.

However, the semiconductor device employing a multilevel interconnection has disadvantages, such as low yield and low reliability, because the construction and fabrication process are complex and the surface of the device is not flat. Most of these disadvantages are due to the degradation of step coverage and the degradation of the depth of focus in exposure process at irregular and uneven portions of the device surface and the step-like portion of a through-hole. Therefore, the planarization technology of insulating layers between the multilevel wiring layers and the device surface are indispensable for multilevel interconnection of the semiconductor device.

The prior planarization technologies are the following:

(1) glass flow method

By reducing the viscosity of the insulating layer by means of curing at a temperature above the softening temperature of the insulating layer, the insulating layer is made to reflow due to self weight, so as to planarize the surface of the insulating layers.

(2) spin coating method

The organic solution containing photo-resist, polyimide resin or glass component is thickly spin-coated upon a surface of a semiconductor substrate and the spin-coated film is hardened by curing to obtain the flat surface.

(3) bias sputtering method

By utilizing the property that the sputter etching speed depends on the incident angle of high energy particle, such as argon, the un-even surface is planarized during the deposition of the insulating layer on the surface.

Among the above-mentioned planarization methods, the spin-coating method is desirable because the glass flow method needs the curing process at high temperature and damage the semiconductor device, and the bias sputtering method has a long throughput and generates high contamination.

In a semiconductor device of multilevel interconnection fabricated by means of spin-coating method, which is described in an article entitled "INTERLEVEL DIELECTRIC PLANARIZATION WITH SPIN-ON GLASS FILMS", by L. B. Vines and S. K. Gupta, Proc. IEEE 1986 V-MIC Conf., pp. 506–515 (1986), insulating layer is the sandwich-like construction composed of the first silicon dioxide film deposited by means of plasma vapor deposition method, an insulating film formed by spin-coating method, and the second silicon oxide film deposited by means of plasma vapor deposition method. This semiconductor device is fabricated according to the following processes.

Upon a semiconductor substrate on which the metal wiring is made, the first silicon oxide film is deposited by means of a plasma vapor deposition method. An intermediate insulating film (called a spin coated film) is formed on the first silicon oxide film by spin coating the organic siloxane polymer followed by curing. Furthermore, the second silicon oxide film is formed on the spin coated film by means of plasma vapor deposition method. Thereafter, through-holes are made through the insulating layer composed of the first silicon oxide film, the spin coated film and the second silicon dioxide film. Then, the metal film is made for the second wiring layer and is patterned and the electric interconnection between two wiring layers is completed via through-holes. In this conventional semiconductor device, the first silicon oxide film and the second silicon oxide film are formed under the same condition and are relatively dense.

For the insulating layer of a sandwich construction using a spin coated film, a thick spin coated film is preferable considering the surface flatness. However, the fact that the film is thick may cause an increase in the possibility of disconnections of the wires in the through-holes.

In the fabrication process of the insulating layer of a sandwich construction, the organic solvent in the spin coated film is exhausted by curing after the spin coating process and the film is hardened. In this process, a small quantity of organic solvent remains in the cured spin coated film. Moreover, the spin coated film adsorbs the water in the atmosphere even after it is dried and hardened by the curing. These residual organic solvent and water become a gas when the metal film is sputtered as the second wiring layer, because the semiconductor substrate is heated in the vacuum. The outgas generated in this manner is flown out through a sidewall of the spin coated film exposed in the through-holes. The spin coated film is corroded owing to the outgas, particularly to its water component. Also, since the through-holes are filled with the outgas, the adhesion of the metal atoms flown from the target to the sidewall of the through-holes are prevented during the formation process of the wiring metal film by sputtering, with the result that the step coverage of the wiring metal film in the through-holes become degraded. If the concentration of the outgas from the spin coated film increases, the corrosion of the metal film in the through-holes and the degradation of the step coverage may increase. In other words, the disconnection of a wire is more probable if the spin coated film is thick and the diameter of the through-hole is small. In the conventional insulating layer of a sandwich construction, it is difficult to realize a semiconductor device using a through-hole having a diameter less than 1 micrometer.

It has been discovered that the disconnections in the through-holes increase if the density of the second silicon oxide film increases. This is because the outgas generated from the spin coated film during the sputtering process can not penetrate through the second silicon oxide film, resulting in its concentration within the through-holes.

SUMMARY OF THE INVENTION

An object of the present invention is to provide a semiconductor device of the multilevel interconnection construction which is free from the disconnection of wires.

Another object of the present invention is to provide a semiconductor device comprising a planarized insulating layer which is free from the disconnection of wires in the through-hole due to corrosion and degradation of step coverage.

The semiconductor device according to the present invention is characterized in that among the insulating layer of a sandwich construction the second silicon oxide film deposited by plasma vapor deposition method is formed as a lower density film.

In the semiconductor device according to the present invention, the dense silicon oxide film is deposited as the first insulating film by means of a plasma vapor deposition method upon a semiconductor substrate on which the first wiring layer is formed. Upon the first silicon insulating film, the spin coated insulating film is formed by means of a spin coating method. On this spin coated film, the lower density silicon oxide film is formed as the second silicon oxide film by means of a plasma vapor deposition method on the spin coated insulating film. On an insulating layer composed of the first silicon oxide film, the spin coated film and the second silicon oxide film, the second wiring layer is deposited.

According to the present invention, the outgas generated from the spin coated film during a heating process, like a sputtering process, of the second wiring layer is exhausted through the second silicon oxide film. Therefore, the outgas does not concentrate in the through-holes. This means that the corrosion of wires and the degradation of step coverage due to outgas do not occur, with the result that the disconnection of a wire in the through-hole does not occur. In addition, since the dense silicon oxide film is used as the first silicon oxide film, a void does not occur even if metal, such as aluminum, is used for the first wiring layer.

It is desirable and effective that the contractions of the first and the second oxide films after the heating process which is under the condition of a nitrogen atmosphere at 900° C. are less than and larger than 3%, respectively because in this percentage of the contractions the through-holes can be formed under the condition of having a diameter which is less than 1 micrometer without disconnection of wires and an un-even surface.

BRIEF DESCRIPTION OF THE DRAWINGS

The above-mentioned and other objects, features and advantages of this invention will become more apparent by reference to the following detailed description of the invention taken in conjunction with the accompanying drawings wherein.

DETAILED DESCRIPTION OF THE PREFERRED EMBODIMENTS

Figure 1A:
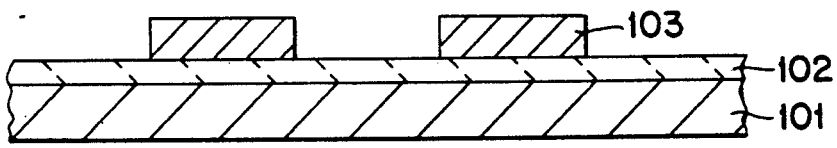
FIGS. 1(a) to (f) are cross-sectional views for illustrating the fabrication processes of the first preferred embodiment of the invention.

Referring to FIGS. 1(a) to 1(f), a semiconductor device according to the first preferred embodiment of the present invention is made as follows. On a monocrystalline semiconductor substrate 101 containing semiconductor elements (not shown) formed therein, an insulating film 102 is formed. The film 102 is 500 nanometers in thickness. The film 102 is the resultant product of a glass flow process of a BPSG film (boro-phospho-silicate glass), which is made by means of a low pressure vapor deposition method using the process gas of diborane ($B_2H_6$) and phosphine ($PH_3$). Then, the aluminum film is deposited on the film 102 by a sputtering method till its thickness is from 0.5 to 1.0 micrometer. After a photo lithography process, the aluminum wirings 103 are formed by etching by means of parallel-plate-type dry etching equipment (FIG. 1(a)). The minimum width and minimum line spacing of the wiring 103 are 0.5 micrometers, respectively.

Figure 1B:
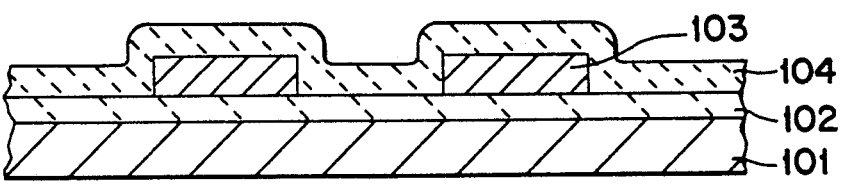
Figure 1C:
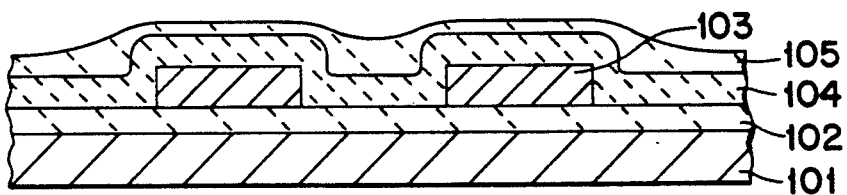
Figure 1D:
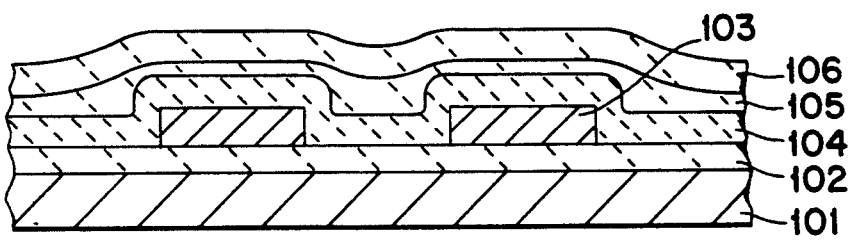
Figure 1E:
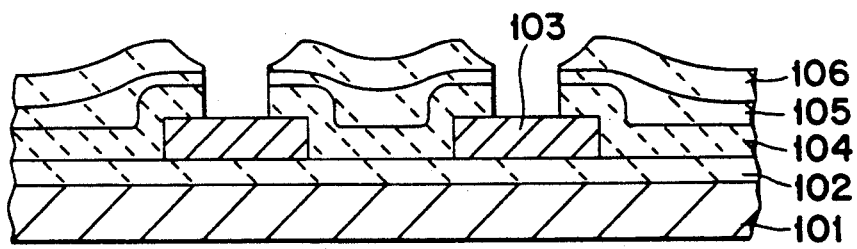
Figure 1F:
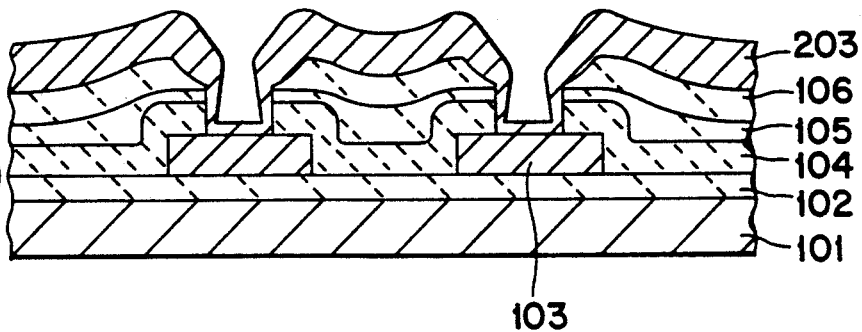

Next, the first silicon oxide film 104 which is about 400 nanometers in thickness is deposited by means of parallel-plate-type plasma vapor deposition equipment (FIG. 1(b)). This film 104 is formed using the process gas of monosilane gas ($SiH_4$), dinitromonooxide gas ($N_2O$) and nitrogen gas ($N_2$) as a dilution gas for the monosilane gas which are flown at flow rates of 70 sccm, 1300 sccm and 280 sccm, respectively. After the three gases are flown, the total gas pressure is set to be 0.25 Torr, and the vapor deposition is performed under the conditions of the discharge power density being 0.5 W/cm$^2$ at a frequency of 400 kHz at a substrate temperature of 300° C. Next, the first silicon oxide film 104 deposited is cured in a nitrogen atmosphere at 900° C. The contraction percentage of the resultant film 104 is 0.8%, which indicates that the first silicon oxide film 104 is quite dense.

Then, a spin coated film 105 is made of organic siloxane polymer solution on the first silicon oxide film by the spin coating method. The solution is spin coated and heated. On this occasion, if the spin coating and heating are repeatedly performed several times, the solvent in the organic siloxane polymer solution can be almost released. In the present embodiment, the spin coating and heating are performed two times. The first spin coating of organic siloxane polymer solution is made and then heating in the nitrogen atmosphere is performed again at 400° C. This application and curing are repeated under the same conditions to make an organic siloxane polymer layer which is the spin coated film 105. (FIG. 1(c)). The thickness of the organic siloxane polymer layer on the first insulating film 104 is 200 nanometers.

Next, the second silicon oxide film 106 is deposited by means of the plasma vapor deposition method with parallel-plate-type vapor deposition equipment and is 400 nanometers in thickness (FIG. 1(*d*)). The deposition condition of the second silicon oxide film 106 is as follows:

The flow rate of monosilane gas ($SiH_4$): 70 SCCM;

The flow rate of dinitromonooxide gas ($N_2O$): 1300 SCCM;

The flow rate of nitrogen gas ($N_2$) as dilution gas for monosilane gas: 280 SCCM;

total gas pressure: 0.35 Torr;

discharge frequency: 400 kHz;

discharge power density: 0.5 $W/cm^2$; and the substrate temperature: 250° C.

If the silicon dioxide film 106 deposited under these conditions is heated in the nitrogen atmosphere at a temperature of 900° C., the contraction rate of the film 106 is 3.5%, which indicates that the density of the film 106 is lower than the first silicon oxide film 104.

After the second silicon oxide film 106 is deposited, it is heated for 10 minutes in the nitrogen atmosphere at 400° C. in order to fully release methane ($CH_4$), carbon dioxide ($CO_2$), water ($H_2O$) and methanol ($CH_3OH$) contained in the organic siloxane polymer film 105. On this occasion, the impurity gas in the spin coated film 105 is released through the second silicon oxide film 106, so that the spin coated film 105 and the second silicon oxide film 106 are not subjected to the delamination of each other and constitute an insulating layer of high quality with the first silicon oxide film 104.

Next, the through-holes (FIG. 1(*e*)) are made at desired positions by means of lithography and a dry etching method with parallel-plate-type dry etching equipment. The minimum diameter of a through-hole is 0.5 micrometers.

Next, the second wiring layer 203 is selectively formed as follows. The sputtered aluminum film is formed on the second silicon oxide film 106 and is 0.5 to 1.0 micrometers in thickness. This film covers the inner surface of the through-holes. This film is formed by means of lithography and dry etching with the parallel-plate-type dry etching equipment. The minimum width and minimum line spacing of the second wiring layer patterns are 0.5 micrometers, respectively.

Since the outgas generated by the sputtering process from the spin coated film 105 is not concentrated in the through-holes and is released through the second silicon oxide film 106, the aluminum wirings in the through holes are not disconnected.

To check for existence of corrosion and deterioration of step coverage of the second wiring layer 203 in the through-holes after the fabrication process, the surface and a cross-section view were observed with a optical microscope and a scanning electron microscope. As an result, no corrosion of the second wiring layer 203 occurred and good step coverage is obtained even when the diameter of the through hole is less than 1 micrometer.

Figure 2:
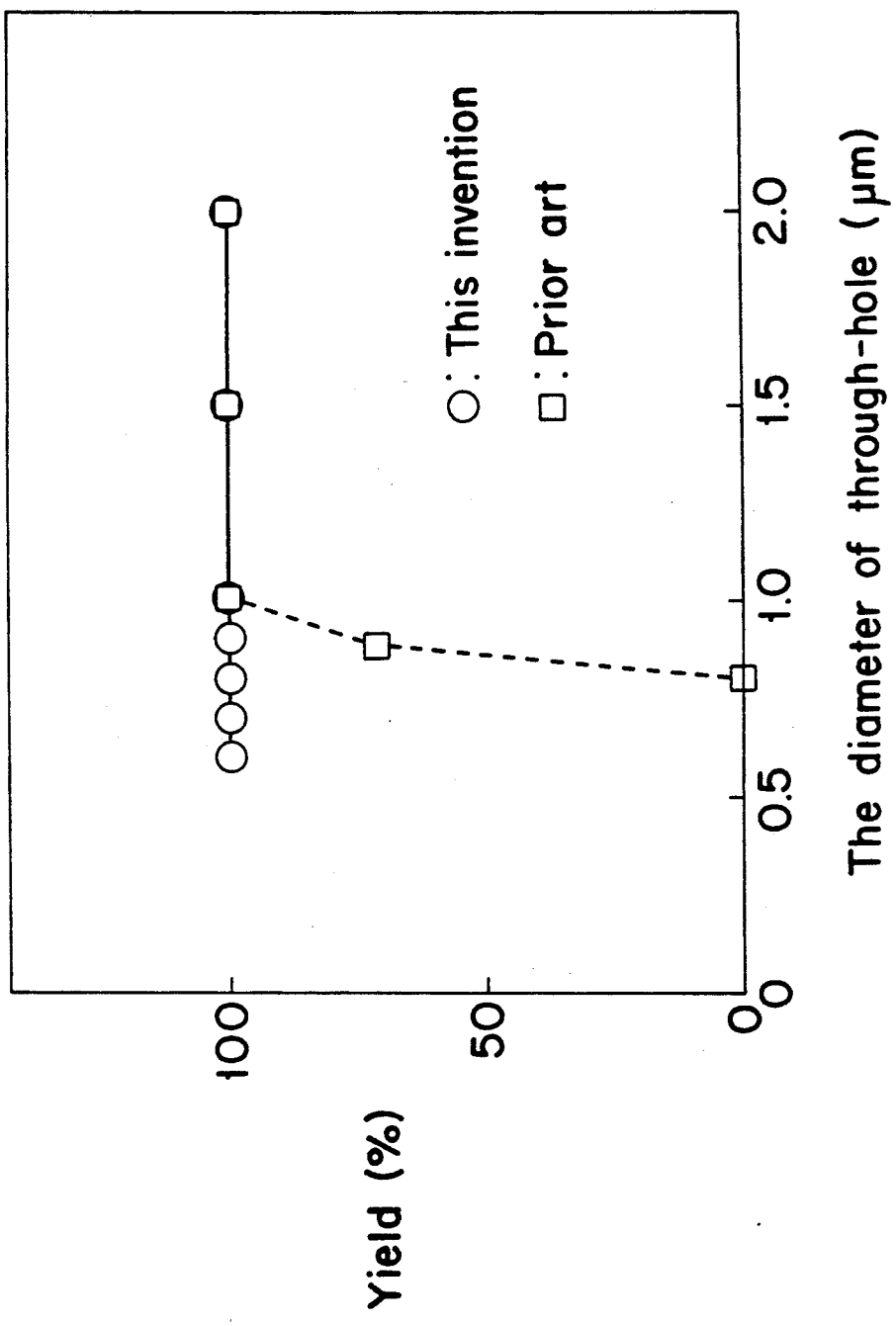
FIG. 2 is a diagram indicating the relation between the yield of good quality in the second aluminum wiring and the diameter of the through-hole in the multilevel wiring of the prior art and the present invention.

FIG. 2 shows the relation between the diameter of the through-hole and the yield of good quality multilevel wirings in the prior art and in the present invention. The electric conductivity between the first wiring layer 103 and the second wiring layer 203 is measured for various diameters of the through-holes to examine the relation between the diameter of the through-hole and yield rate of good quality. Referring to FIG. 2, the yield of the wiring in the prior art is considerably degraded if the diameter of the through-hole is less than 1.0 micrometer. Even in this condition, the yield of the present invention is not degraded and no disconnection of the wire occurs. Therefore, the interlevel insulating layer according to the present invention has a superior flat surface and there is no corrosion and no degradation of step coverage in the through-holes if their diameters are less than 1.0 micrometer. Also, since the first wiring layer 103 is covered with the dense first silicon oxide film 104, no void occurs after the heating process.

In the second embodiment of the present invention, the first and the second silicon oxide films 104 and 106 can obtain better flatness by employing the gas system containing tetraethoxy-orthosilicate (TEOS).

The deposition condition of the first silicon oxide film is as follows.

The flow rate of helium (He) gas for bubbling TEOS (37° C.): 500 SCCM

The flow rate of oxygen gas: 500 SCCM

The gas pressure of oxygen gas: 9 Torr discharge frequency: 13.56 MHz high frequency power density: 2 $W/cm^2$ substrate temperature: 355° C.

The deposition condition of the second silicon oxide film 106 is almost the same as the first film 104 using TEOS except the condition of the high frequency power density which is 1.3 $W/cm^2$.

Figure 3A:
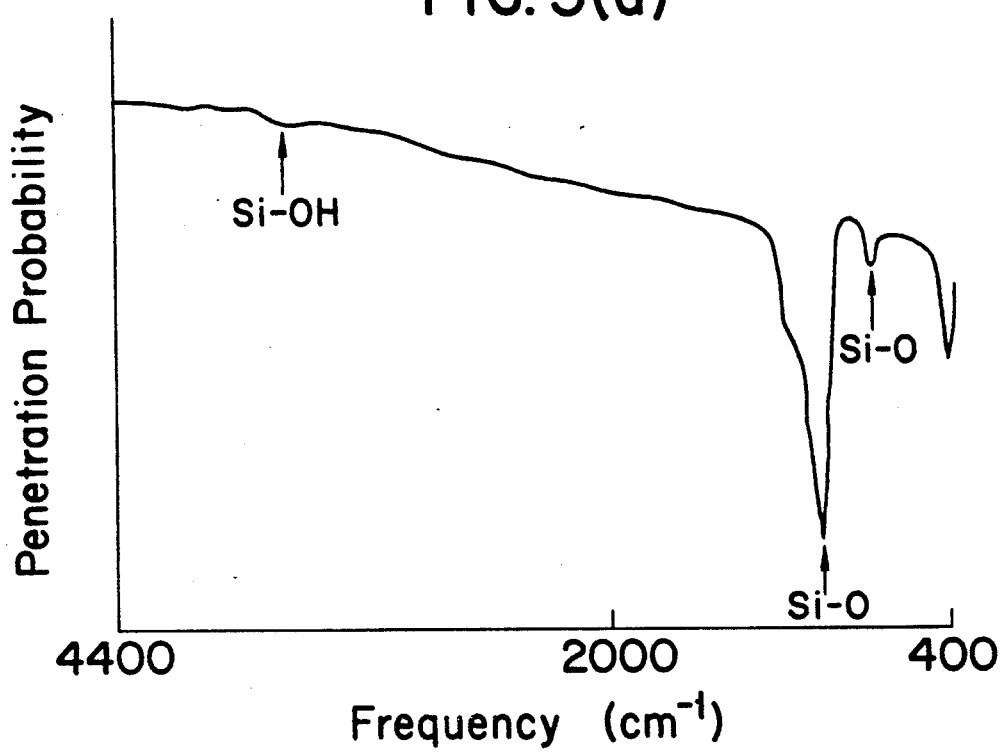
FIGS. 3(a) and (b) are diagrams indicating the infra red absorption spectra of the first and the second silicon oxide films deposited by employing tetraethoxyorthosilicate (TEOS) according to the second preferred embodiment of the invention, respectively.
Figure 3B:
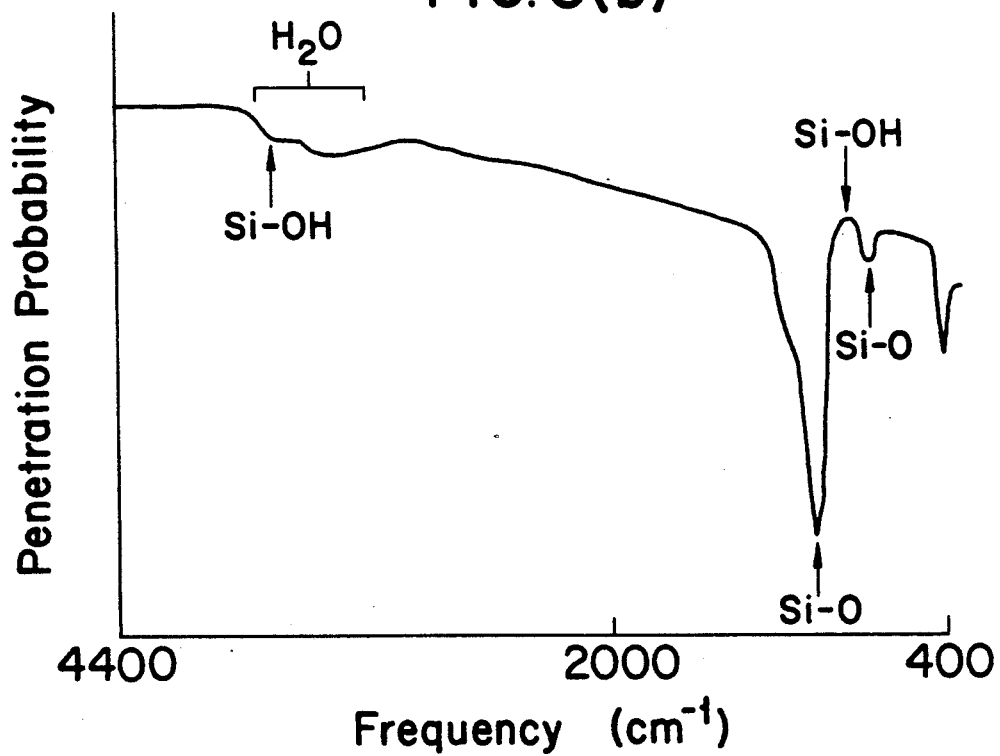

Referring to FIG. 3(*a*), the infra-red absorption spectrum of the silicon oxide film deposited under the above condition is almost identical to that of silicon oxide film deposited by thermal oxidization method. Also, the film contraction rate of this first silicon oxide film 104 after heating in the nitrogen atmosphere at 900° C. is 1.28%. This value means that the dense film is deposited.

The deposition condition of the second silicon oxide film 106 is the same as the first film 104 except that the high frequency power density is changed to 1.3 $W/cm^2$. Referring to FIG. 3(*b*), the infra-red absorption spectrum of the second silicon oxide film 116 indicates that it contains a Si-OH bond and $H_2O$ more than the first silicon oxide film 104 does. This means that a lower density film is deposited. The film contraction rate of this silicon oxide film after heating in the nitrogen atmosphere at 900° C. is 4.76%. The insulating film employing these first and second silicon oxide films has good flatness characteristics, with the result that two and/or more layer wirings can be realized without disconnection of wires for through-holes of a diameter less than 1 micrometer.

Although the invention has been described with reference to specific embodiments, this description is not meant to be constructed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the scope of the invention.

What is claimed is:

1. A semiconductor device comprising; a first wiring layer, an insulator layer formed on said first wiring layer and including a first silicon oxide film, a spin-coated insulating film formed on said first silicon oxide film and a second silicon oxide film formed on said spin-coated insulating film, a through-hole selectively formed in said insulator layer to expose a part of said first wiring layer, and a second wiring layer formed on said insulator layer and in contact with said part of said first wiring layer exposed through said through-hole, wherein said second silicon oxide film has a density that is lower than the density of said first silicon oxide film and allows gas from said spin-coated insulating film to go through said second silicon oxide film.

2. A semiconductor device as claimed in claim 1, wherein said first silicon oxide film has a contraction rate of 3% or less.

3. A semiconductor device as claimed in claim 1, wherein said second silicon oxide film has a contraction rate of 3% or more.

4. A semiconductor device as claimed in claim 1, wherein said spincoated insulating film is made of an organic siloxane polymer.

5. A semiconductor device comprising: a semiconductor substrate selectively covered by a first insulating film, a plurality of first wiring layers formed on said first insulating film, an insulation layer formed on said plurality of first wiring layers and including a first silicon oxide film, a spin-coated insulating film formed on said first silicon oxide film and a second silicon oxide film formed on said spin-coated insulating film, said first silicon oxide film being formed by means of a plasma vapor deposition method, said spin-coated insulating film being formed by means of a spin coating method on said first silicon oxide film, said second silicon oxide film being formed by means of a plasma vapor deposition method on said spin-coated insulating film, at least one through-hole selectively formed in said insulation layer to expose a part of at least one of said plurality of first wiring layers, and a plurality of second wiring layers selectively formed on said insulation layer, at least one of said plurality of second wiring layers being in contact with said part exposed through said at least one through-hole, and said second silicon oxide film having a density that is lower than the density of said first silicon oxide film and allows gas from said spin-coated insulating film to go through said second silicon oxide film.

6. A semiconductor device comprising: at least one first wiring layer selectively formed on an insulating layer formed on a semiconductor substrate, a multilevel insulation layer formed on said insulating layer and said first wiring layer, said multilevel insulation layer including a first silicon oxide film, an organic siloxane polymer film formed on said first silicon oxide film and a second silicon oxide film formed on said organic siloxane polymer film, at least one contact hole selectively formed in said multilevel insulation layer to expose a part of said first wiring layer, and at least one second wiring layer selectively formed on said multilevel insulation layer and connected to said part of said first wiring layer exposed through said contact hole, wherein said second silicon oxide film has a density that is lower than the density of said first silicon oxide film and allows gas from said organic siloxane polymer film to pass through said second silicon oxide film.

* * * * *